United States Patent
Rambaud et al.

(10) Patent No.: US 10,476,464 B2
(45) Date of Patent: Nov. 12, 2019

(54) COMMON MODE FILTER DEVICE AND ELECTRICAL EQUIPMENT

(71) Applicant: MITSUBISHI ELECTRIC CORPORATION, Tokyo (JP)

(72) Inventors: Luc Rambaud, Rennes (FR); Stefan Mollov, Rennes (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 4 days.

(21) Appl. No.: 15/572,276

(22) PCT Filed: Jun. 20, 2016

(86) PCT No.: PCT/JP2016/068936
§ 371 (c)(1),
(2) Date: Nov. 7, 2017

(87) PCT Pub. No.: WO2016/208762
PCT Pub. Date: Dec. 29, 2016

(65) Prior Publication Data
US 2018/0123543 A1    May 3, 2018

(30) Foreign Application Priority Data

Jun. 26, 2015  (EP) ..................................... 15306018

(51) Int. Cl.
*H03H 7/01*        (2006.01)
*H02M 1/12*        (2006.01)

(52) U.S. Cl.
CPC ............ *H03H 7/0115* (2013.01); *H02M 1/12* (2013.01); *H03H 7/0138* (2013.01); *H02M 2001/123* (2013.01)

(58) Field of Classification Search
CPC . B60R 16/00; B60R 16/03; B60T 1/00; B60T 1/10; B60T 17/00; B60T 17/22;
(Continued)

(56) References Cited

U.S. PATENT DOCUMENTS

2012/0014143 A1*  1/2012  Schueneman ......... H02M 1/126
                                                         363/40
2018/0246149 A1*  8/2018  Ragaini .............. G01R 19/2506

FOREIGN PATENT DOCUMENTS

CN            202798437 U    3/2013
DE    10 2008 062 133 A1    6/2010
(Continued)

OTHER PUBLICATIONS

Japanese Office Action with English translation issued in corresponding Japanese Application No. 2017-544363 and dated Jul. 23, 2018.
(Continued)

*Primary Examiner* — Lincoln D Donovan
*Assistant Examiner* — Dave Mattison
(74) *Attorney, Agent, or Firm* — Birch, Stewart, Kolasch & Birch, LLP (57) ABSTRACT

A common mode filter device (2) comprises two LC-filters (21, 22) which are serially connected, two transformers (23, 25) and an active current control circuit (24). The transformers are dedicated to sensing a common mode current and injecting compensation currents driven by the current control circuit. The transformers provide electric isolation between the current control circuit and power-transferring connections of the common mode filter device. Continuing operation of an electrical apparatus which is power-supplied through the common mode filter device is also ensured in case of failure of the current control circuit, with the LC-filters still producing partial common mode filter function.

13 Claims, 3 Drawing Sheets

(58) Field of Classification Search
CPC .. H01F 29/00; H01F 29/02; H02J 3/00; H02J 3/34; H02M 1/00; H02M 1/12; H02M 2001/00; H02M 2001/123; H03H 7/00; H03H 7/0115; H03H 7/0138
USPC .......................................................... 307/21
See application file for complete search history.

(56) References Cited

FOREIGN PATENT DOCUMENTS

| | | |
|---|---|---|
| JP | 2004-357447 A | 12/2004 |
| JP | 2006-136058 A | 5/2006 |
| JP | 2006-140953 A | 6/2006 |
| WO | WO 2010/100934 A1 | 9/2010 |

OTHER PUBLICATIONS

Heldwein et al., "Implementation of a Transformerless Common-Mode Active Filter for Offline Converter Systems", IEEE Transactions on Industrial Electronics, May 2010, vol. 57, 1 page.

* cited by examiner

COMMON MODE FILTER DEVICE AND ELECTRICAL EQUIPMENT

TECHNICAL FIELD

The invention relates to a common mode filter device and also to an electrical equipment which comprises such common mode filter device.

BACKGROUND ART

Many electrical apparatuses incorporate power converters which are switching-based with high switching frequency. Due to fast switching transitions, switching-based operation which is implemented in one apparatus produces electromagnetic interference which is transmitted to the AC network used for supplying power to this apparatus, and also transmitted to other apparatuses. In particular, common mode currents which are produced by one apparatus may cause damages to other apparatuses which are also powered by the same AC network. For example, reliability and lifetime of motors are significantly affected by such common mode currents. Indeed, capacitive couplings exist between the stator and rotor of a motor, so that a shaft voltage which is due to the common mode currents may cause electrical discharges through the motor air gap, which then may damage the insulation barrier. Also mechanical unbalance and wearing of the rotor bearings may be caused by the common mode currents.

Because of these reasons, electromagnetic interference (EMI) standards such as CISPR 11/EN 55011 and CISPR 22/EN 55022 set limits for the common mode currents which are transmitted by an electrical apparatus back to the power-supplying AC network. Plural form is used for the common mode currents due to their magnitudes for all frequency values. Then for meeting the requirements of these standards, some electrical apparatuses have to be equipped with common mode filter devices.

Such common mode filter device is electrically inserted between the apparatus and the AC network, so as to form a barrier against transmission of the common mode currents from the apparatus to the AC network. Because such barrier has to be effective for common mode current for industrial applications, the common mode filter device is commonly comprised of one or several low-pass filters, each low-pass filter being based on at least one capacitor and at least one inductor. For example, such common mode filter device to be connected between the electrical AC network and an electrical apparatus may comprise:

- a first electrical connection which is dedicated for connecting an earth terminal of the AC network to a common terminal of the apparatus;
- at least two second electrical connections each for connecting a respective phase terminal of the AC network to a respective power terminal of the apparatus; and
- separately for each second electrical connection: two LC-filters which are arranged serially, each LC-filter comprising a separate capacitor which is connected between this second electrical connection and the first electrical connection, and each LC-filter also comprising a separate common mode inductor which is arranged in the second electrical connection upstream of the capacitor of the same LC-filter, relative to a direction from the AC network to the apparatus.

Such common mode filter device is of passive type. It is more efficient for reducing the common mode currents which are produced by the apparatus when each inductor and each capacitor have large values, but the unit price of the common mode filter device is then higher. Also the common mode filter device is then bulky and large, resulting in heavy and cumbersome electrical equipments.

Active filters are also well known. For example, one LC-filter comprised of one inductor and one capacitor connected as indicated above, may be completed with an active circuit which is arranged for sensing the voltage or the current at the filter output, on the AC network side. Then the active circuit is equivalent to a current source which is connected in parallel to the AC network, or to a voltage source which is connected serially between the LC-filter and the AC network. In both cases, the active circuit is designed so that the equivalent current source or voltage source reduces the common mode current which is transmitted back into the AC network. A major advantage of such active common mode filter devices is to allow reducing the values of the inductor and capacitor of the LC-filter while maintaining substantially constant efficiency for reducing the common mode currents. As a consequence, the common mode filter device is reduced in size and price. Such active common mode filter devices are presented in particular in Non Patent Literature 1.

In particular, there are already active common mode filter devices which implement magnetic operation for sensing the common mode currents which are transmitted to the AC network.

CITATION LIST

Non Patent Literature

[NPL 1]
Heldwein M. L., Ertl H., Biela J. and Kolar J. W: "Implementation of a Transformerless Common-Mode Active Filter for Offline Converter Systems", Industrial Electronics, IEEE Transactions on, vol. 57, no 5, pp. 1772-1786, May 2010

SUMMARY OF INVENTION

Technical Problem

General issues for a filter device are the isolation issue, the failure impact and the stability issue.

The isolation issue deals with safety. For this purpose, there is a great interest for device designs where no electrical path connects any of the phase terminals of the AC network to the earth terminal.

The failure impact deals with operation of the apparatus continuing without disturbance even when the common mode filter device encounters itself a failure. It depends on the electrical components which are used and their arrangement and implementation within the common mode filter device.

The stability issue relates to using an active circuit. The output impedance of an electrical apparatus to be equipped with one common mode filter device varies depending on the apparatus. Furthermore the active common mode filter must remain stable when reducing the common mode current whatever is the AC network impedance within an impedance range as large as possible.

Starting from this situation, one object of the present invention consists in providing a novel common mode filter device which reduces to a greater extent the common mode currents which are transmitted back to the AC network.

Other objects of the invention relate to the isolation issue, failure impact and stability issue presented above.

Still other objects of the invention relate to reducing the unit price and the geometrical size of the common mode filter device.

Solution to Problem

For meeting at least one of these objects or others, a first aspect of the present invention proposes a common mode filter device of the type presented above, which comprises two serially-connected LC-filters for each second electrical connection between the electrical AC network and the electrical apparatus.

According to the invention, the common mode filter device further comprises two transformers and a current control circuit. Then, a secondary winding of a first one of the transformers is arranged for producing a detection voltage which is representative of a common mode current existing in the second electrical connections. In addition, the current control circuit is arranged for sensing the detection voltage and for generating a control current in a primary winding of the second one of the transformers.

According to a further feature of the invention, the common mode inductor of the LC-filter which is closest to the apparatus for each second electrical connection is a respective secondary winding of the second transformer, separately for each second electrical connection, so as to generate a compensation current in this common mode inductor. Hence the second transformer comprises one primary winding which is current-fed by the current control circuit, and as many secondary windings as the number of phase terminals of the AC network.

Then, the current control circuit and both transformers are adapted so that the injected currents, denoted compensation current just above, compensate at least partially for the sensed common mode current which is transmitted into the second electrical connections by the apparatus from its power terminals.

Thus, the common mode filter device of the invention is a special combination of a passive filter device which is based on two LC-filters with an additional current control circuit which acts as an active circuit.

In addition, magnetic operation is implemented for both sensing the common mode current which is transmitted to the AC network and injecting compensation currents into the second electrical connections.

Also in the common mode filter device of the invention, the current control circuit is electrically isolated from the phase terminals of the AC network, since it interacts with the second electrical connections only though the first and second transformers with separate windings. Put another way, there is a galvanic isolation between the current control circuit and the phase terminals of the AC network.

Also in the common mode filter device of the invention, an operation failure of the current control circuit leads to a rise in the common mode current, but the electrical apparatus goes on working normally. The electromagnetic interference standards will be possibly no longer met, but without impeding the use of the apparatus. Such situation only requires a maintenance work during the next stop of the apparatus, and meanwhile both LC-filters maintain a partial reduction of the common mode current.

Hence, both transformers of the invention common mode filter device act as fault-tolerant multi-purpose magnetic components.

In the common mode filter device of the invention, the compensation current is injected into each second electrical connection between the respective capacitors of both LC-filters of this second electrical connection. So the capacitor of the LC-filter which is closest to the apparatus provides the necessary voltage termination for the compensation current injection. In addition, the conducted common mode current is sensed immediately at this interface with the AC network. The stability of the common mode filter device is independent of the feeder impedance between the common mode filter device and the AC network.

In addition, the current control circuit as an active circuit allows reducing the values of the inductors and capacitors, and their sizes as a consequence, while substantially maintaining the reduction efficiency for the common mode current. So the common mode filter device can be reduced in size, and its unit cost can be further reduced. In particular, most of or all the electrical components of the common mode filter device may be substrate-mounted components, such as PCB-mounted components (PCB standing for printed circuit board), components mounted on ceramic substrate, or components integrated with a silicon wafer. Then the common mode filter device may be produced using machines or robots only, without separate components to be mounted by an operator.

Furthermore, the sensing and compensating parts of the active circuit are comprised of windings which are additional to the coils of the inductors of the LC-filters. Put another way, each transformer has a hybrid or combined function of pertaining to the corresponding passive LC-filter, and also producing the function of sensing the common mode current or compensating for it in the second electrical connections. However, the transformers are each implemented in the common mode filter device as one single component, with total reduced size compared to separate components.

In some implementations of the invention, the common mode filter device may further comprise at least one damping circuit, this damping circuit comprising a damping resistor and a damping capacitor which are serially connected. Also, the second transformer may further comprise another winding which is connected in closed loop with the damping resistor and the damping capacitor. Then, the damping resistor and damping capacitor may be selected so that a resonance effect of at least one of the LC-filters on an insertion loss function which is relative to the common mode filter device is reduced or suppressed. The efficiency of the common mode filter device is thus more progressive over the whole frequency range.

In preferred implementations of the invention, the current control circuit may comprise a compensator and a current buffer. The compensator is adapted for feeding the current buffer with an intermediate signal which varies as a function of the detection voltage. The current buffer is adapted for acting as a current generator which outputs the control current as a function of the intermediate signal. The current control circuit together with the second transformer thus operates as a current source which produces the compensation currents. This operation further reduces the influence of the output impedance of the apparatus on the stability of the whole electrical equipment. One same common mode filter device can thus be used with a further increased number of different apparatuses. Mass production with constant values for the components contributes to reducing the unit price of the common mode filter device.

In most preferred ones of such implementations, the current control circuit may further comprise optionally:

a direct signal suppression module, which has an input connected to a node between the compensator and the current buffer, and also an output connected to an input of the compensator, and which is adapted for reducing or cancelling a direct component of the intermediate signal;

a direct current compensation module which is arranged so as to reduce or cancel a direct component of the control current; and a protection module when the intermediate signal is a control voltage, this protection module being connected to a node between the compensator and the current buffer, and also connected to an exit terminal of the primary winding of the second transformer, this exit terminal being opposed to the current buffer for the primary winding of the second transformer.

Generally in the invention, the common mode inductor of the LC-filter which is closest to the AC network for each second electrical connection may form a respective primary winding of the first transformer. With such filter design, the first transformer comprises as many primary windings as the number of phase terminals of the AC network, and the secondary winding forming one additional winding.

According to an alternative filter design, the secondary winding of the first transformer which produces the detection voltage may be a Rogowski-type sensor. Such Rogowski-type sensor is then arranged at the second electrical connections for detecting the common mode current which exists in the common mode inductors of the LC-filters closest to the AC network.

A second aspect of the invention proposes an electrical equipment comprising an electrical apparatus and a common mode filter device which is in accordance with the first invention aspect. The common mode filter device is then arranged for transferring electrical power from an AC network to the apparatus when the equipment is connected to the AC network. Within the equipment, the common terminal of the apparatus is connected to the first electrical connection of the common mode filter device, and the power terminals of the apparatus are respectively connected to the second electrical connections of the common mode filter device. With such connections, the common mode filter device is effective for compensating for the common mode current which is produced by the apparatus and transferred to the first and second electrical connections, so that the AC network receives compensated common mode current.

The apparatus of the electrical equipment may comprise an electrical rotating machine. In particular, the electrical rotating machine may be a motor which is coupled with a motor drive unit.

Alternatively, the apparatus may comprise a photovoltaic system which includes at least one photovoltaic panel coupled with a DC-AC power generator.

These and other features of the invention will be now described with reference to the appended figures, which relate to preferred but not-limiting embodiments of the invention.

DESCRIPTION OF EMBODIMENTS

Figure 1:
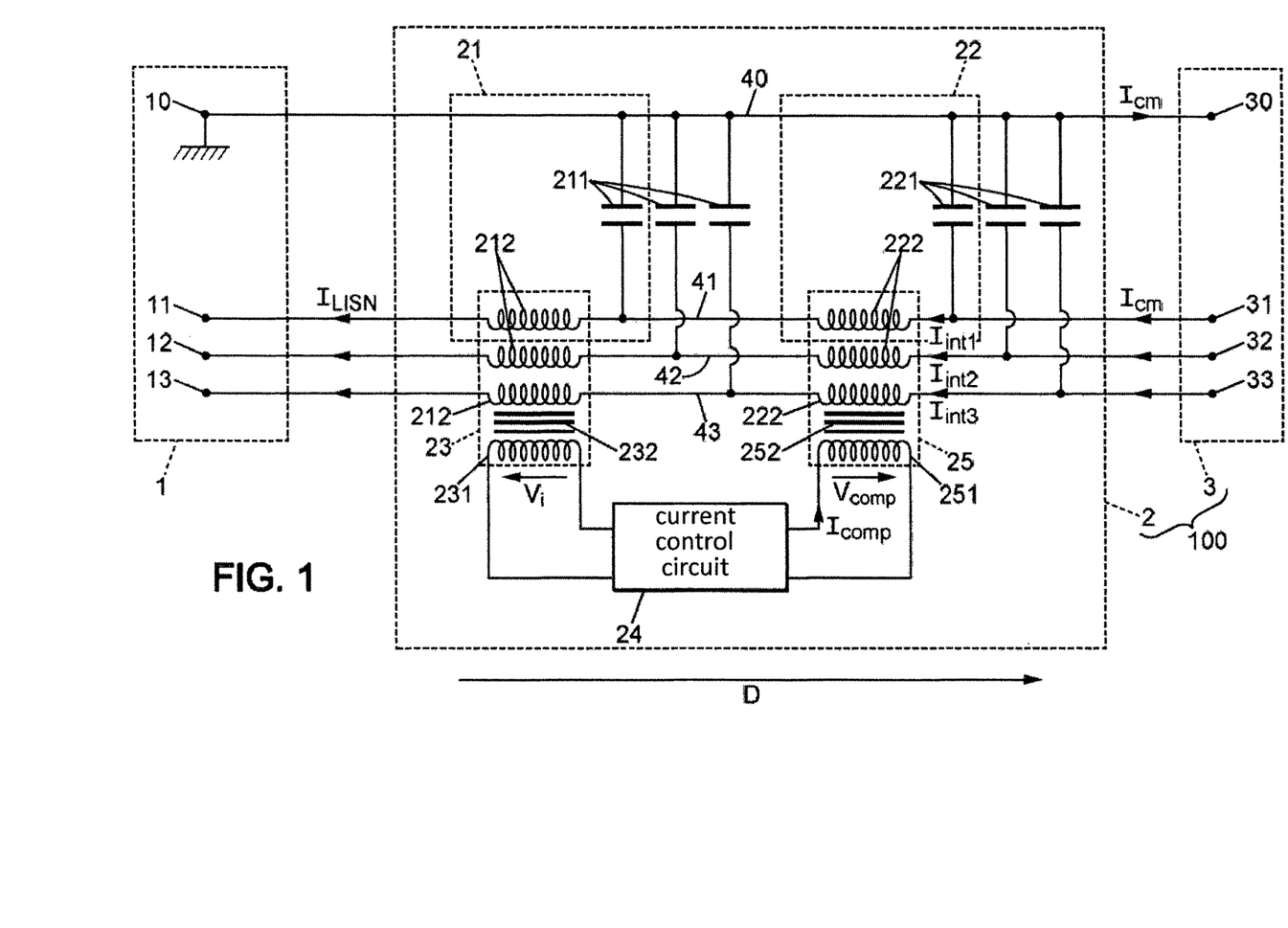
FIG. 1 is a diagram of an electrical equipment which includes a common mode filter device according to the invention.

The reference numbers indicated in FIG. 1 have the following meanings:
1 AC network for supplying power to an electrical apparatus
10 earth terminal of the AC network
11, 12, 13 phase terminals of the AC network, in case of a three-phase AC network
2 the common mode filter device
3 electrical apparatus, for example an electrical rotating machine or a photovoltaic system
30 common terminal of the electrical apparatus
31, 32, 33 power terminals of the electrical apparatus
100 electrical equipment formed by the common mode filter device 2 and the electrical apparatus 3 connected to one another
40 first electrical connection of the common mode filter device 2
41, 42, 43 second electrical connections of the common mode filter device 2
21, 22 two LC-filters for each second electrical connection 41-43
23 first transformer
24 current control circuit
25 second transformer
211, 221 capacitors of the LC-filters 21 and 22, respectively
212, 222 inductors of the LC-filters 21 and 22, respectively
231 secondary winding of the first transformer 23
232, 252 magnetic cores of the first and second transformers 23, 25
251 primary winding of the second transformer 25
D circuitry direction oriented from the AC network 1 to the electrical apparatus 3, for defining words such as upstream and downstream used in the description In figures, same reference numbers which are indicated in different figures denote identical elements of elements with identical function.

The common mode filter device 2 may be provided as a stand-alone device to be purchased separately from the apparatus 3. Alternatively, it may be combined with the electrical apparatus 3 for forming with this latter the electrical equipment 100. Small dimensions of the common mode filter device 2 make it easy to add it within a housing of the apparatus 3, and in particular in combination with a power converter of this apparatus.

The first electrical connection 40 electrically connects the earth terminal 10 of the AC network 1 to the common terminal 30 of the electrical apparatus 3.

The AC network 1 which is represented is three-phase as an example, but the invention can be implemented for a two-phase AC network, by deleting the second electrical connection 43.

The second electrical connection 41 electrically connects the phase terminal 11 of the AC network 1 to the power terminal 31 of the electrical apparatus 3. Similarly, the second electrical connection 42 electrically connects the phase terminal 12 of the AC network 1 to the power terminal 32 of the electrical apparatus 3. This is complete for a two-phase AC network but when the AC network 1 is three-phase, the further second electrical connection 43 electrically connects the phase terminal 13 of the AC network 1 to the power terminal 33 of the electrical apparatus 3. The electrical connections 40-43 transmit the electrical power which is necessary for the operation of the apparatus 3, from the AC network 1 to the apparatus terminals 30-33.

One of the inductors 212 is arranged within the second electrical connection 41, and one capacitor 211 is connected between the connections 40 and 41 downstream the inductor 212. The capacitor 211 and the inductor 212 form one LC-filter 21. Each other second electrical connection 42 and 43 is equipped identically with a respective LC-filter 21 based on one separate capacitor 211 and one separate inductor 212. All capacitors 211 are identical and all inductors 212 are identical. The capacitors 211 and the inductors 212 may be selected so that each LC-filter 21 is a low-pass filter with cut-off frequency of some hundreds of kHz. Then the LC-filters 21 may be called high-frequency filters, and the component values thereof are labelled hf later in this description.

Similarly, one of the inductors 222 is arranged within the second electrical connection 41, and one capacitor 221 is connected between the connections 40 and 41 downstream the inductor 222. The capacitor 221 and the inductor 222 form one LC-filter 22. Each other second electrical connection 42 and 43 is equipped identically with a respective LC-filter 22 based on one separate capacitor 221 and one separate inductor 222. All capacitors 221 are identical and all inductors 222 are identical. The capacitors 221 and the inductors 222 may be selected so that each LC-filter 22 is a low-pass filter with cut-off frequency of some tens of kHz. Then the LC-filters 22 may be called middle-frequency filters, and the component values thereof are labelled mf later in this description.

With respect to the direction D, the LC-filters 21 and 22 are arranged serially for each connection 41-43, with the LC-filter 21 upstream from the LC-filter 22.

Figure 2:
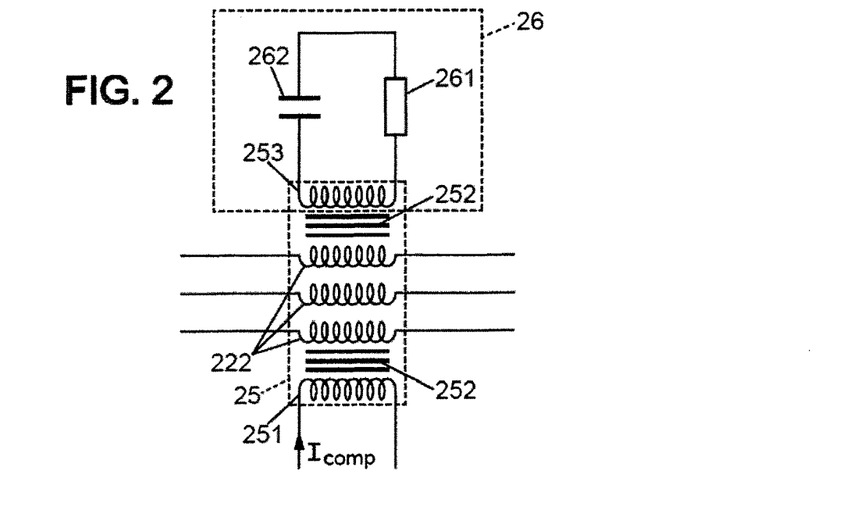
FIG. 2 illustrates an improvement of the invention for avoiding a resonance effect on a loss function of the common mode filter device of FIG. 1.

But each of the LC-filters 21, 22 may produce a resonance in a well-known manner, which reduces the filtering efficiency at the cut-off frequency. Put another way, when considering the loss function defined as the ratio of the expected common mode current value without using the filter device 2 over the measured common mode current value when using the filter device 2, the filter resonance decreases the loss function values in a spectral range which contains the cut-off frequency. For avoiding such effect, the transformer 25 may comprise an additional winding 253 as represented in FIG. 2. Then, a damping circuit 26 may be provided which contains at least one damping resistor 261, at least one damping capacitor 262, and the additional winding 253, all connected serially in a closed loop. Then the values for these components of the damping circuit 26 can be selected easily by the Man skilled in electrical technics for reducing the resonance effect on the loss function. Possibly a single damping circuit of this kind may be provided for reducing or suppressing the resonance effect of the LC-filters 21, or of the LC-filters 22, or two damping circuits may be provided in parallel which are respectively dedicated to the LC-filters 21 and the LC-filters 22.

Alternatively for reducing or suppressing the resonance effect of the LC-filters 22, it is also possible to add a RC-branch in parallel with each capacitor 221, for the three connections 41-43. Similar RC-branches may also be added in parallel with the capacitors 211 for reducing or suppressing the resonance effect of the LC-filters 21.

According to first embodying modes for the invention which correspond to FIG. 1, the three inductors 212 are further combined within the transformer 23 so as to form three primary windings of this latter. The transformer 23 then also comprises the secondary winding 231, and all windings of the transformer 23 are arranged so that the secondary winding 231 operates as a current sensor: the secondary winding 231 produces across a resistor (denoted 240 in FIG. 4 and called load resistance below) a detection voltage $V_i$ which is proportional to the sum of the currents which flow separately in the three inductors 212 with identical orientations relative to the direction D. All windings of the transformer 23 may be arranged around the common magnetic core 232. The magnetic core 232 may be a ferrite core in particular. The value of the inductors 212 can thus be high, so that such design is more adapted for apparatuses which implement small or intermediate currents. But such limited currents avoid saturation effects which may be caused by the magnetic core 232. The high inductor value is also suitable for obtaining a cut-off frequency in the range of few hundreds of kHz for the LC-filter 21. With such design, the transformer 23 is a discrete component which includes the three common mode inductors 212, the secondary winding 231 and the magnetic core 232 in a single unit component. It can be mounted on a PCB substrate used for the LC-filters 21 without occupying much substrate surface.

Figure 3:
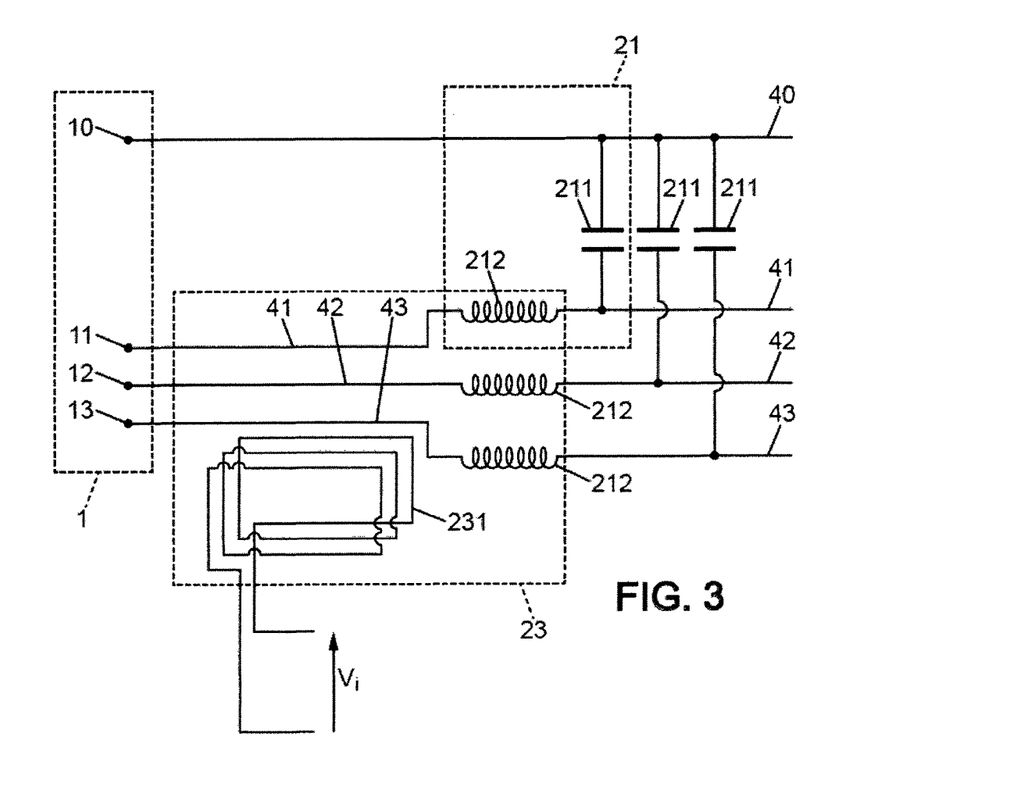
FIG. 3 illustrates an alternative embodiment of the invention which relates to a sensing part of the common mode filter device.

According to second invention embodying modes which are alternative to the first ones and correspond to FIG. 3, the secondary winding 231 may be a Rogowski coil as represented. Such coil is located near a zone where the three connections 41-43 are running in parallel with same current orientation and close to each other. Because a Rogowski coil does not implement any magnetic core, no saturation effect is involved over a very large frequency range. But the mutual induction value of such secondary winding is quite low in general, although depending on its number of turns. So such alternative design is more adapted for apparatuses with large currents. In addition, a Rogowski coil can be easily integrated in a PCB substrate if enough substrate surface is available.

Generally in the invention, the three inductors 222 are combined within the transformer 25 so as to form three secondary windings of this latter. The transformer 25 then also comprises one primary winding 251 (FIG. 1 or 3), and all windings of the transformer 25 are arranged so that a control current $I_{comp}$ which flows in the primary winding 251 produce in the three inductors 222 currents which are equal and proportional to $I_{comp}$, with identical orientations relative to the direction D.

A common mode current $I_{cm}$ which is produced by the electrical apparatus 3 from the power terminals 31-33, is indicated in FIG. 1. Then, the current control circuit 24 is adapted for producing the control current $I_{comp}$ based on the detection voltage $V_i$, so that the current which is produced by the transformer 25 in each one of the inductors 222 compensates at least partially the common mode current $I_{cm}$ within the corresponding second electrical connection 41-43. Hence, the transformer 25 operates as a current injector, and the currents which are produced by the transformer 25 in the inductors 222 have been called compensation currents in the general part of this description.

Because of their arrangements in the transformers 23 and 25, the inductors 212 and 222 have been called common mode inductors.

A preferred embodiment of the current control circuit 24 is now described with reference to FIG. 4. The base components of the current control circuit 24 are a compensator 241 and a current buffer 242.

The compensator 241 has an integrator function so that an intermediate signal which is outputted by this compensator is proportional to the common mode current which flows in the common mode inductors 212. For example, the secondary winding 231 of the first transformer 23 may be connected in closed loop with a load resistor 240, and both inputs of the compensator 241 are connected to both terminals of the load resistor 240. The compensator 241 may comprise at least one among a proportional-integral and/or proportional-integral-derivative compensator stage. For example, the compensator 241 outputs a control voltage denoted $V_o$ as the intermediate signal. This control voltage $V_o$ is then transmitted to the current buffer 242.

The current buffer 242 acts as a current generator which outputs the control current $I_{comp}$ as a function of the control voltage $V_o$. Thus for each frequency above the mf cut-off frequency, the compensation currents which are produced by the windings 222 may be substantially proportional to the detection voltage $V_i$. In embodiments which can be designed by anyone skilled in the art, the current buffer 242 may comprise at least one push-pull transistor assembly and possibly one or several driving stages. Reference number 245 denotes a load resistance which is arranged for correct operation of the current buffer 242.

But possibly in such current control circuit, troubles may arise from undesired offset signal components which are produced by the compensator 241 and/or by the current buffer 242.

For this purpose, the current control circuit 24 may further comprise a direct signal suppression module 243. This direct signal suppression module 243 is dedicated to reducing or cancelling a direct component possibly existing in the control voltage $V_o$. It has an input which is connected to a node N located between the compensator 241 and the current buffer 242, and has an output which is connected to one of the compensator inputs for producing a negative feedback. Any well-known DC-compensator structure may be used for the direct signal suppression module 243, which is efficient for reducing or suppressing the direct component of the control voltage $V_o$.

Independently or in combination with implementing the direct signal suppression module 243, the current control circuit 24 may further comprise a direct current compensation module 244. Such direct current compensation module 244 is dedicated to reducing or cancelling a direct component of the control current $I_{comp}$ which is outputted by the current buffer 242. It may comprise a low-pass filter 2441 which is connected at the exit terminal of the primary winding 251 of the second transformer 25, so that the low-pass filter 2441 senses a low frequency component existing in the control current $I_{comp}$. Then the direct current compensation module 244 also comprises a subtraction-effective arrangement 2442 which is connected between the compensator 241 and the current buffer 242. The output terminal of the low-pass filter 2441 is connected to the subtraction-effective arrangement so as to subtract from the control voltage $V_o$ a signal which is representative of the low frequency component existing in the control current. Also the low-pass filter 2441 may comprise itself a proportional-integral compensator.

Optionally, the current control circuit 24 may further comprise a protection module 246 which is dedicated to avoiding that the current buffer 242 produces a control current $I_{comp}$ which is too large. The protection module 246 is connected to the node N between the compensator 241 and the current buffer 242, and also connected to the exit terminal of the primary winding 251 of the second transformer 25. Connection of the protection module 246 to the exit terminal of the primary winding 251 may encompass the load resistor 245, and the connection of the protection module 246 between the compensator 241 and the current buffer 242 may be on either side of the subtraction-effective arrangement 2442 if this latter is used. For example, the protection module 246 may comprise two diodes which are connected in parallel and with opposed current-conducting directions, and this diode assembly is serially combined with a resistor as represented in FIG. 4. Such structure of the protection module 246 is cheap, but other structures may be used alternatively, in particular without resistor.

Figure 4:
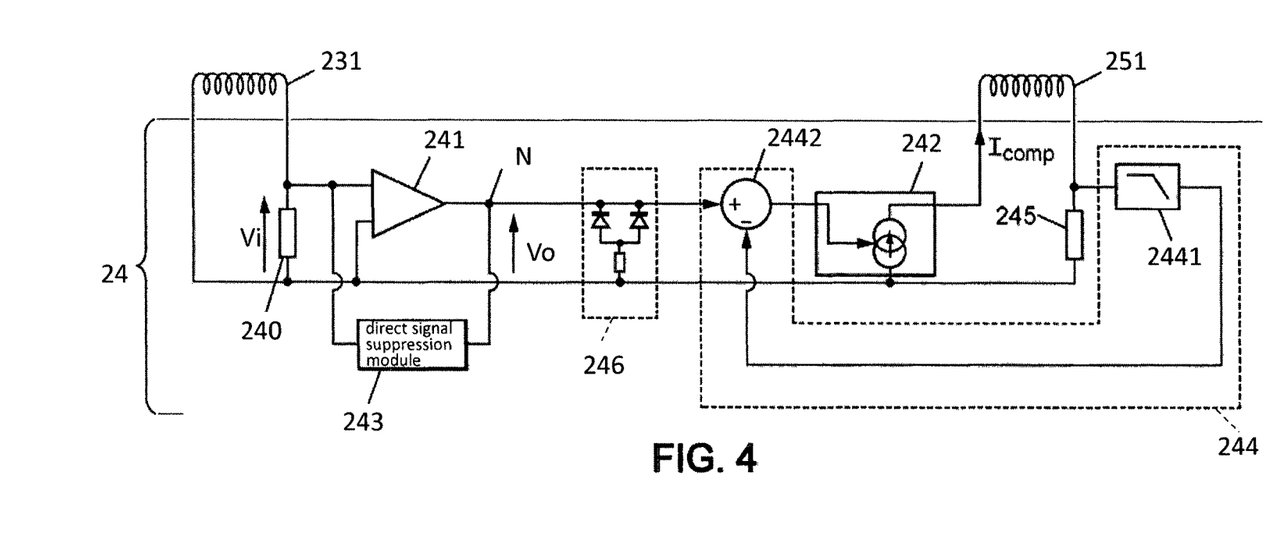
FIG. 4 is a diagram of a current control circuit which may be used in preferred embodiments of the invention.

The following developments prove the efficiency of the common mode filter device as implemented according to FIGS. 1 and 4, in the frame of a two-phase AC network only for being short. Similar developments but for a three-phase AC network can be extrapolated therefrom easily.

If $V_{comp}$ denotes the voltage across the primary winding 251 of the second transformer 25, then:

$$V_{comp}=L_p \cdot p \cdot I_{comp}+M \cdot p \cdot (I_{int1}+I_{int2})$$

where $L_p$ is the inductance value of the primary winding 251, M is the mutual inductance between the primary winding 251 and each common mode inductor 222, p is the Laplace parameter associated to the frequency and $I_{int1}$, $I_{int2}$ are the currents in the common mode inductors 222 as indicated in FIG. 1. Also the voltage across each common mode inductor 222 is:

for connection 41:

$$V_{t1}=M \cdot p \cdot I_{comp}+L_s \cdot p \cdot I_{int1}+m \cdot p \cdot I_{int2}$$

and also for connection 42:

$$V_{t2}=M \cdot p \cdot I_{comp}+L_s \cdot p \cdot I_{int2}+m \cdot p \cdot I_{int1}$$

where $L_s$ is the inductance value of each inductor 222 and m is the mutual inductance value between two inductors 222. Then a factor k meets the followings: $M=k \cdot (L_p \cdot L_s)^{1/2}$ and $m=k \cdot L_s$.

For symmetry reason: $I_{Int1}=I_{int2}$ noted $I_{int}$, so that:

$$V_{comp}=L_p \cdot p \cdot I_{comp}+2 \cdot M \cdot p \cdot I_{int}$$

$$V_t=V_{t1}=V_{t2}=M \cdot p \cdot I_{comp}+(L_s+m) \cdot p \cdot I_{int}$$

Then the common mode current $I_{cm}$ which originates from each one of the power terminals 31-33 of the apparatus 3 is:

$$I_{cm}=I_{int}+C_{mf} p \cdot V_{Cmf} \text{ with } V_{Cmf}=V_{Chf}+V_t$$

where $C_{mf}$ is the capacitor value of each capacitor 221, $V_{Cmf}$ is the voltage across each capacitor 221 and $V_{Chf}$ is the voltage across each capacitor 211.

This leads to:

$$I_{mc}=I_{int}+C_{mf} p \cdot (V_{Chf}+V_t)$$

and the remaining current equations are:

$$I_{int}=I_{LISN}+C_{hf} p \cdot V_{Chf}$$

$$V_{Chf}=(R_{LISN}+L_{hf} p) \cdot I_{LISN}$$

which combine into:

$$I_{int}=I_{LISN} \cdot (1+R_{LISN} \cdot C_{hf} p+C_{hf} L_{hf} p^2)$$

where $C_{hf}$ is the capacitor value of each capacitor 211, $I_{LISN}$ is the value of the current which is transmitted by each one of the second electrical connections 41-43 respectively to the phase terminals 11-13, and $R_{LISN}$ is the input resistance value which is admitted for the AC network 1 between each one of the phase terminals 11-13 and the earth terminal 10. LISN stands for line impedance stabilization network, which is an intermediate device prescribed by the EMI standards for conducting electromagnetic interference and compatibility tests.

Solving all previous equations leads to the following formula for the common mode current:

$$I_{cm} = I_{LISN} \cdot F_t + M \cdot C_{mf} p^2 \cdot I_{comp}$$

where $$F_t = (1 + R_{LISN} \cdot C_{hf} p + C_{hf} \cdot L_{hf} p^2)[1 + (L_s + m) \cdot C_{mf} p^2] + C_{mf} p \cdot (R_{LISN} + L_{hf} p)$$

From this formula for $I_{cm}$, it comes:

$$I_{LISN} = (I_{mc} - M \cdot C_{mf} p^2 \cdot I_{comp}) / F_t$$

Therefore, the condition for the exact compensation of the common mode current, namely $I_{LISN} = 0$, is:

$$I_{comp} = I_{cm} / (M \cdot C_{mf} p^2)$$

Figure 5:
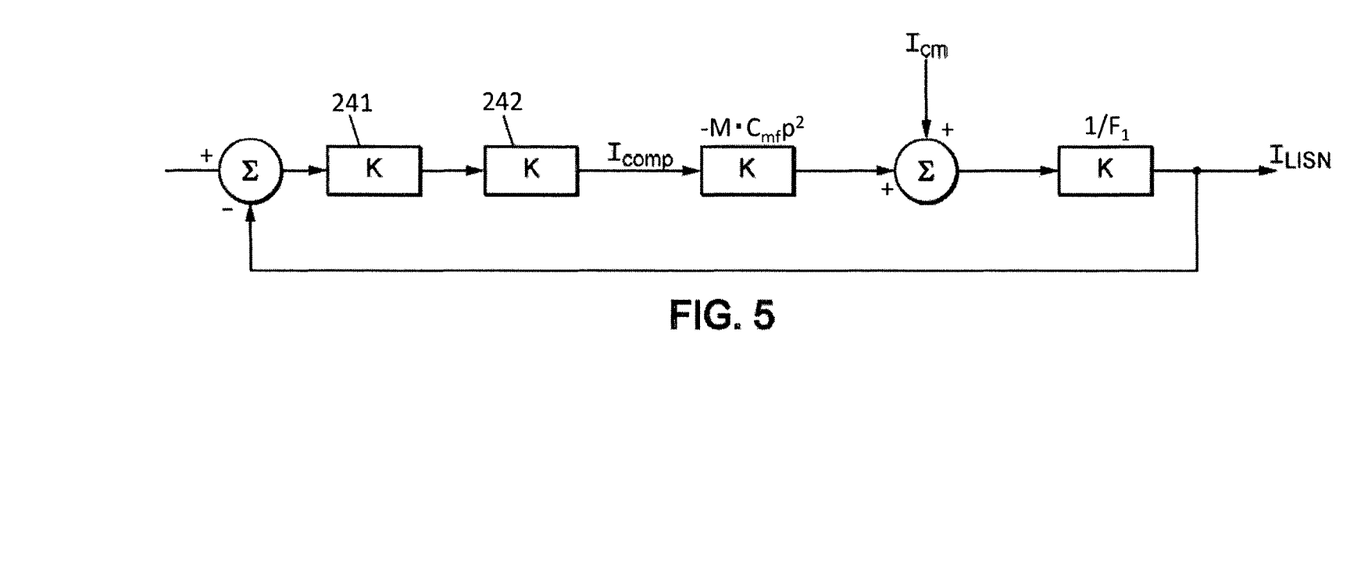
FIG. 5 is a function block diagram of the electrical equipment of FIG. 1 when the current control circuit of FIG. 4 is used.

This is the operation characteristic to be produced by the current control circuit 24. This corresponds to the function block diagram of FIG. 5, where symbol K indicates each time a multiplier-type operator and symbol Σ indicates an adder-type operator. This diagram shows that the compensation of the common mode current actually results from the injection of currents in the second electrical connections 41-43 in the opposite way from the common mode current. The resulting current which is transmitted by each second electrical connections 41-43 to the AC network 1 is therefore reduced by an identical extent for all the connections 41-43, corresponding to common mode compensation.

The invention may be reproduced while modifying or adapting secondary aspects but maintaining at least some of the cited advantages. In particular, the intermediate signal may be a current instead of the control voltage $V_o$. Necessary adaptations of the current control circuit 24 relating to such change are within the scope of the Man skilled in the art.

INDUSTRIAL APPLICABILITY

The common mode filter device and the electrical equipment of this invention are applicable to systems in many kinds of fields.

The invention claimed is:

1. A common mode filter device adapted for being connected between an electrical AC network and an electrical apparatus, said common mode filter device comprising:
a first electrical connection dedicated for connecting an earth terminal of the AC network to a common terminal of the electrical apparatus;
at least two second electrical connections each for connecting a respective phase terminal of the AC network to a respective power terminal of the electrical apparatus;
at least one damping circuit, said damping circuit comprising a damping resistor and a damping capacitor which are serially connected; and
separately for each second electrical connection: two LC-filters arranged serially, each LC-filter comprising a separate capacitor connected between said second electrical connection and the first electrical connection, and each LC-filter also comprising a separate common mode inductor arranged in said second electrical connection upstream of the capacitor of the same LC-filter, relative to a direction from the AC network to the apparatus, wherein
the common mode filter device further comprises two transformers and a current control circuit,
a secondary winding of a first one of the transformers being arranged for producing a detection voltage representative of a common mode current existing in the second electrical connections,
the current control circuit being arranged for sensing the detection voltage and for generating a control current in a primary winding of a second one of the transformers,
the common mode inductor of the LC-filter closest to the electrical apparatus for each second electrical connection being a respective secondary winding of the second transformer, so as to generate a compensation current in said common mode inductor of the LC-filter closest to the electrical apparatus of each second electrical connection,
the second transformer further comprises another winding connected in closed loop with the damping resistor and the damping capacitor, and the damping resistor and damping capacitor are selected so that a resonance effect of at least one of the LC-filters on an insertion loss function relative to the common mode filter device is reduced or suppressed, and
in that the current control circuit and both transformers are adapted so that the compensation currents compensate at least partially for the common mode current which is transmitted into the second electrical connections by the electrical apparatus from the power terminals.

2. The common mode filter device according to claim 1, wherein the current control circuit comprises a compensator and a current buffer, the compensator being adapted for feeding the current buffer with an intermediate signal, said intermediate signal varying as a function of the detection voltage, and the current buffer is adapted for acting as a current generator which outputs the control current as a function of the intermediate signal.

3. The common mode filter device according to claim 2, wherein the compensator comprises at least one proportional-integral or a proportional-integral-derivative compensator stage.

4. The common mode filter device according to claim 2, wherein the current control circuit further comprises a direct signal suppression module, said direct signal suppression module having an input connected to a node between the compensator and the current buffer, and an output connected to an input of said compensator, and being adapted for reducing or cancelling a direct component of the intermediate signal.

5. The common mode filter device according to claim 2, wherein the current control circuit further comprises a direct current compensation module arranged so as to reduce or cancel a direct component of the control current.

6. The common mode filter device according to claim 5, wherein the direct current compensation module comprises a low-pass filter connected at an exit terminal of the primary winding of the second transformer, so that the low-pass filter senses a low frequency component existing in the control current, and the direct current compensation module also comprises a subtraction-effective arrangement connected between the compensator and the current buffer, and an output terminal of the low-pass filter is connected to the subtraction-effective arrangement so as to subtract a signal representative of the low frequency component existing in the control current from the intermediate signal.

7. The common mode filter device according to claim 2, wherein the intermediate signal is a control voltage, and the current control circuit further comprises a protection module connected to a node between the compensator and the current buffer, and connected to an exit terminal of the primary winding of the second transformer, which is opposed to the current buffer.

8. The common mode filter device according to claim 1, wherein the common mode inductor of the LC-filter closest to the AC network for each second electrical connection form a respective primary winding of the first transformer.

9. The common mode filter device according to claim 1, wherein the secondary winding of the first transformer is a Rogowski-type sensor arranged at the second electrical connections for detecting the common mode current existing in the common mode inductors of the LC-filters closest to the AC network.

10. The common mode filter device according to claim 1, wherein all electrical components of said common mode filter device are substrate-mounted components.

11. An electrical equipment comprising an electrical apparatus and a common mode filter device, said common mode filter device being in accordance with claim 1, and arranged for transferring electrical power from an AC network to said electrical apparatus when the electrical equipment is connected to the AC network, with the common terminal of the electrical apparatus connected to the first electrical connection of the common mode filter device, and the power terminals of the electrical apparatus respectively connected to the second electrical connections of the common mode filter device so that said common mode filter device is effective for compensating for a common mode current which is produced by the electrical apparatus and transferred to the first and second electrical connections, and so that the AC network receives compensated common mode current.

12. The electrical equipment according to claim 11, wherein the electrical apparatus comprises an electrical rotating machine.

13. The electrical equipment according to claim 11, wherein the electrical apparatus comprises a photovoltaic system, which the photovoltaic system includes at least one photovoltaic panel coupled with a DC-AC power generator.

* * * * *